US006413826B2

(12) United States Patent
Kim (10) Patent No.: US 6,413,826 B2
(45) Date of Patent: *Jul. 2, 2002

(54) GATE INSULATOR PROCESS FOR NANOMETER MOSFETS

(75) Inventor: Hyeon-Seag Kim, Sunnyvale, CA (US)

(73) Assignee: Vantis Corporation, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/287,976

(22) Filed: Apr. 7, 1999

(51) Int. Cl.⁷ .............................................. H01L 21/336

(52) U.S. Cl. ..................... 438/287; 438/294; 438/296

(58) Field of Search ................................ 438/287, 294, 438/296

(56) References Cited

U.S. PATENT DOCUMENTS

| | | | | |
|---|---|---|---|---|
| 5,372,950 A | * | 12/1994 | Kim et al. | 438/444 |
| 5,763,922 A | * | 6/1998 | Chau | 257/371 |
| 6,037,018 A | * | 3/2000 | Jang et al. | 427/579 |
| 6,093,619 A | * | 7/2000 | Huang et al. | 438/400 |
| 6,110,784 A | * | 8/2000 | Gardner et al. | 438/287 |
| 6,165,854 A | * | 12/2000 | Wu | 438/296 |

OTHER PUBLICATIONS

Stanley Wolf Ph.D and Richard N. Tauber Ph.D. in Silicon Processing for the VLSI Era, vol. 1: Process Technology, Lattice Press, 1986, pp. 280–281.*

C.T. Liu, et al., "High Performance 0.2 μm CMOS with 25 Å Gate Oxide Grown on Nitrogen Implanted Si Substrates," *IEDM*, pp. 96–499, 1996.

Hyeon–Seag Kim, et al., Electrical Reliability of Metal–Organic Chemical Vapor Deposited High Permittivity $TiO_2$ Dielectric Metal–Oxide–Semiconductor Field Effect Transistors, *IEEE*, pp. 90–96, 1997.

C.T. Liu, et al., Multiple Gate Oxide Thickness for 2GHz System–on–A–Chip Technologies, *IEDM*, pp. 589–592, 1998.

Manchanda, L., "Gate Quality Doped High K Films for CMOS Beyond 100nm: 3—10nm $Al_2O_3$ with Low Leakage and Low Interface States," *IEDM*, pp. 605–608, 1998.

(List continued on next page.)

*Primary Examiner*—Wael Fahmy
*Assistant Examiner*—William M. Brewster
(74) *Attorney, Agent, or Firm*—Fliesler, Dubb, Meyer & Lovejoy (57) ABSTRACT

Methods of manufacturing insulating materials and semiconductor devices incorporating films having high dielectric constants are disclosed, in which the high-dielectric constant material is deposited on a semiconductor surface that has been treated to prevent the formation of interfacial oxide between the semiconductor substrate and the high, dielectric constant material. The methods of this invention involve implantation of nitrogen ions through the sacrificial oxide layer, thereby forming a nitrided silicon substrate underneath the sacrificial oxide. The sacrificial oxide can then removed, and thereafter layers of high dielectric constant materials can be deposited on the nitrided silicon substrate without the formation of interfacial oxide. Manufacturing devices using the methods of this invention can result in the formation of an overall insulating film having a dielectric constant that more closely reflects the dielectric constant of the high-dielectric constant material. Therefore, the insulating films made using the methods of this invention can be made thinner than conventional insulating films, thus permitting the manufacture of semiconductor products having increasing device density and increasing efficiency, and decreasing manufacturing costs.

47 Claims, 6 Drawing Sheets

OTHER PUBLICATIONS

Mukesh Khare, et al., "Extending scaling limit of tunnel oxide by the use of nitride/oxynitride iin flash memory devices," *IEEE; Non–Volatile Semiconductor Memory Workshop,* pp. 95–97, 1998.

Hyeon–Seag Kim, et al., "Determination of effects of deposition and anneal properties for tetranitratotitanium deposited TiO$_2$ dielectrics," *Journal of Applied Physics,* 85(5):1–4, Mar. 1, 1999.

S.E. Thompson, "Transistor Structures and Advanced Front End Processing for ULSI," 1998 Symposium on VLSI Technology, Honolulu, Hawii, Jun. 8, 1998.

Xin Guo, et al., "High Quality Ultra–thin TiO$_2$Si$_3$N$_4$ Gate Dielectric for Giga Scale MOS Technology," *IEEE: Non–Volatile Semiconductor Memory Workshop,* 1998.

Donggun Park, et al., "Si/Ta$_2$O$_5$/TiN Gate–Stack Transistor with 1.8nm Equivalent SiO2 Thickness," *IEEE: Non–Volatile Semiconductor Memory Workshop,* 1998.

B. Ho, et al., "A 1.1 nm Oxide Equivalent Gate Insulator Formed Using TiO$_2$ on Nitrided Silicon," *IEEE: Non–Volatile Semiconductor Memory Workshop* (1998).

\* cited by examiner

GATE INSULATOR PROCESS FOR NANOMETER MOSFETS

BACKGROUND OF THE INVENTION

1. Field of the Invention

This invention relates to the manufacture of semiconductor devices, particularly devices having a nitrided silicon substrate manufactured by nitrogen ion implantation and having high dielectric constant insulators.

2. Description of Related Art

As semiconductor devices are made smaller to accommodate desired increases in device density, it is desirable to decrease the dimensions of the insulating elements in the devices. Particularly, the minimum dimensions of metal on silicon field effect transistors ("MOSFETS") in semiconductors can be limited by the requirements for effective insulation, or "gate insulation" between the silicon substrate and gates. For example, in non-volatile memory devices, the gate insulator prevents charge leakage from occurring between the gate and the substrate. Typically, an insulator such as $SiO_2$ is used to provide the gate, and is called "gate oxide." However, the minimum thickness of the insulating layers can be determined in part by the dielectric constant of the insulating material. Therefore, as semiconductor device density increases and device dimensions become smaller, it becomes increasingly useful to provide insulating materials that have high insulating capability. Recently, materials having high insulating capability and high capacitance have become available, and have been used to provide alternatives to $SiO_2$ as gate insulators.

A. Semiconductor Device Manufacture

Figure 1:
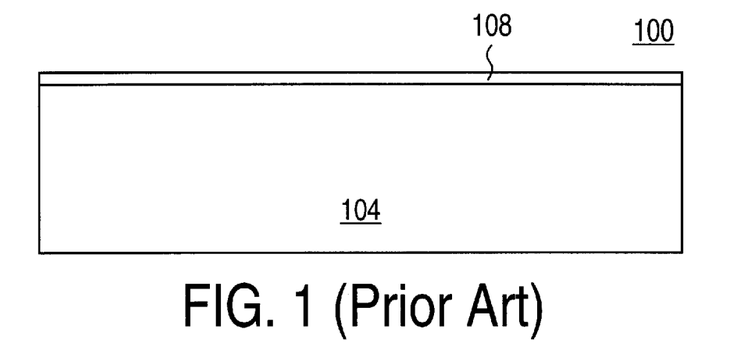
FIG. 1 depicts a semiconductor wafer of the prior art having a layer of silicon oxide.
Figure 2:
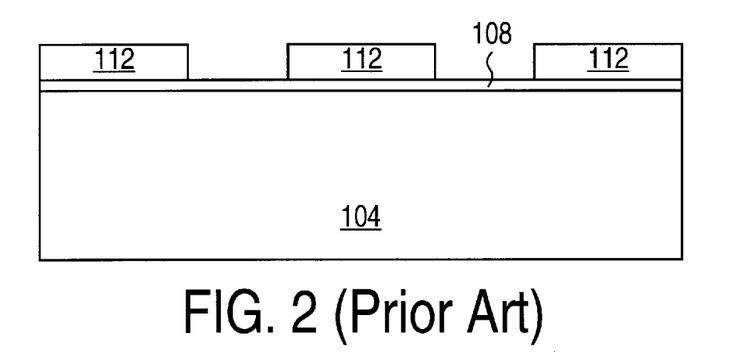
FIG. 2 depicts a prior art semiconductor wafer depicted in FIG. 1 and having a patterned layer of nitride on the surface of the oxide layer.
Figure 3:
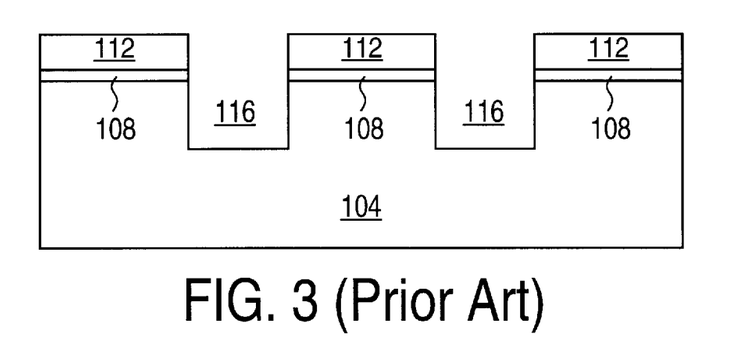
FIG. 3 depicts the prior art wafer shown in FIG. 2, but additionally having shallow trenches inscribed in the wafer.

The manufacture of semiconductor devices is typically carried out by creating areas of isolation or insulation on a semiconductor substrate, such as silicon, and then forming active devices between the areas of electrical isolation. The semiconductor substrate can typically be a p-doped substrate, although one can alternatively use an n-doped substrate. Insolation areas can be manufactured, by way of example, using Shallow Trench Isolation ("STI"), whereby areas of electrical isolation are formed by inscribing trenches in the silicon substrate and then filling the trenches with an insulating material, including, by way of example only, a silicon oxide. The prior art methods of manufacturing devices using STI are depicted in FIGS. 1–3. FIG. 1 depicts a semiconductor wafer 100 comprised of a silicon substrate 104 and having a layer of pad oxide ("Pox") 108 formed thereon. The pad oxide can be formed by way of example, by dry oxidation of silicon in the presence of oxygen ($O_2$) at a temperature of about 950° C. for about 30 minutes. FIG. 2 depicts the semiconductor wafer shown in FIG. 1, but after the layer of pad oxide 108 is formed, a photoresist mask (not shown) is applied to the substrate and a layer of nitride 112 is deposited over the wafer, leaving those areas uncovered where shallow trenches are to be formed. FIG. 3 depicts the same semiconductor wafer as in FIG. 1 and 2, but after a shallow trench 116 has been formed in the substrate between the areas having the nitride layers 112. The nitride layer 112 can act as an etch-stop layer to prevent the removal of substrate 104 during the formation of shallow trenches, thus providing for localized areas of electrical isolation. Subsequently, the shallow trenches are filled with a dielectric material such as silicon dioxide, and thereafter the nitride layer 112 is removed, thereby exposing the layer of pad oxide 108.

The next step in semiconductor device manufacture is typically the deposition of a layer of insulating material or gate insulator on the pad oxide. Gate insulating layers are typically made of $SiO_2$ and after formation of a gate insulator, the manufacture of semiconductor devices involves the deposition of a conductive material on top of the insulating material, thereby forming a "gate" structure which forms part of the active device elements. Because the dielectric constant of $SiO_2$ is about 3.9, and other materials can have dielectric constants higher than that of $SiO_2$, it can be desirable to incorporate other, high-dielectric constant materials into gate insulators.

B. High-Dielectric Constant Insulators

One indicator of a material's ability to act as an electrical insulator is the dielectric constant ("K"). The dielectric constant is a measure of the ability of an insulator to prevent the discharge of electric current between conductive elements through the insulator. Better insulators have higher dielectric constants. The dielectric constant is quantified by comparing the insulating ability of an insulating material to the insulating ability of air, which has a dielectric constant defined to be 1.0. The commonly used dielectric material, silicon dioxide ($SiO_2$) has a dielectric constant of about 3.9. High dielectric constant materials are herein defined to have dielectric constants of greater than 3.9. In contrast, insulators having dielectric constants of less than 3.9 are herein considered to be low dielectric constant insulators.

Examples of high dielectric constant materials include tantalum pentoxide ($Ta_2O_5$), aluminum oxide ($Al_2O_3$), silicon nitride ($Si_3N_4$), zirconium dioxide ($ZrO_2$), titanium dioxide ($TiO_2$), barium-strontium-titanium oxide ("BST"), and lead-zirconium-titanium oxide ("PZT"), although other materials can also be used. Tantalum pentoxide has a dielectric constant of about 30, and therefore, is a useful material because it can be made into an insulating layer having high capacitance. Other materials, having dielectric constants up to about 200 are known in the art, and can be desirably used as gate insulators.

High-dielectric constant materials are desired for use as insulators because of the possibility that the increased dielectric constant and capacitance can permit the use of thinner layers of insulating materials, permitting device dimensions to be smaller than previously possible using more conventional insulators. Therefore, to take advantage of high-dielectric constant materials, instead of depositing $SiO_2$ as the gate oxide, more recent manufacturing methods have incorporated high dielectric constant materials. Unfortunately, conventional manufacturing methods involving high dielectric constant insulators can suffer from the problem of interfacial oxide formation between the silicon substrate and the high dielectric material.

C. Sacrificial Oxide and Interfacial Oxide Layers

Figure 4:
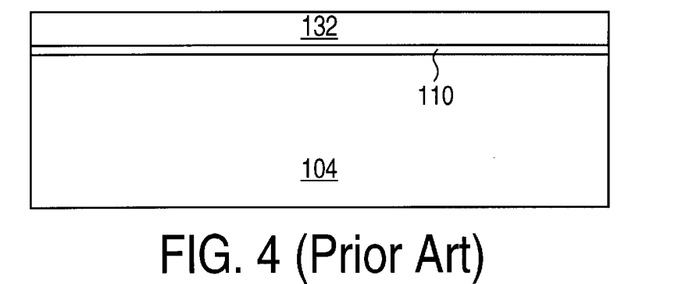
FIG. 4 depicts a prior art semiconductor wafer having a layer of high dielectric constant material deposited on the top of an oxide layer.

Silicon wafers, as depicted in FIG. 1, typically can have a thin layer of oxide 108 on the surface. This layer of oxide can be termed "sacrificial oxide" or "pad oxide." As depicted in FIG. 4, with the deposition of the high dielectric constant material 132, a layer of silicon oxide 110 ("interfacial oxide") can form under the high dielectric constant material. The interfacial oxide can have the structural formula $Si_xO_y$, where x and y are not necessarily integers. Although the interfacial oxide can be thin, it can provide an oxide equivalent thickness of about 10 Å. Oxide equivalent thickness ("$Ox_{eq}$") of an insulating layer X, is defined as the thickness of a layer of $SiO_2$ sufficient to provide the same accumulation capacitance as the insulating layer X. $Ox_{eq}$ can be calculated from the thickness of the insulating layer, T, and dielectric constant of the insulator, K, according to the formula:

$$Ox_{eq} = \frac{T \times 3.9}{K}.$$

However, like conventional gate oxide, interfacial oxide has a dielectric constant of about 3.9. Thus, the conductive layer of the gate structure is separated from the silicon substrate by the layer of high dielectric constant material and the interfacial oxide which underlies the high dielectric constant layer.

Nevertheless, as device dimensions are reduced, and as the thickness of the high dielectric constant layer is reduced, the capacitance of the insulator should remain at a high, desirable level. Unfortunately, the formation of a layer of interfacial oxide during deposition of the high-dielectric constant material can result in the formation of a mixed insulating layer. This mixed layer can have a capacitance less than that of the high dielectric constant material alone. This is because the capacitance of the total insulating layer can be determined by the capacitances of both the high dielectric constant material and of the oxide. The total capacitance ("$C_{total}$") of such a mixed layer of high dielectric constant ("Hi-K") material and an oxide such as $SiO_2$ can be related to each other as follows:

$$\frac{1}{C_{total}} = \frac{1}{C_{oxide}} + \frac{1}{C_{Hi-K}},$$

wherein $C_{oxide}$ is the capacitance of the oxide layer and $C_{Hi-K}$ is the capacitance of the high-dielectric constant material. For mixed insulators as depicted in FIG. 4, comprising both high dielectric constant material 132 and interfacial oxide 110, the presence of $SiO_2$ effectively decreases the gate oxide equivalent thickness of the combined insulating layer. The interfacial oxide can offset the gate oxide equivalent thickness of the high dielectric constant material, and thereby decreasing the capacitance of the mixed insulating layer compared to the same thickness of high dielectric constant material alone. Using conventional manufacturing methods the promise of thin, high dielectric constant layers has been difficult to realize. Therefore, to provide thin insulating layers comprising high dielectric constant materials, it is desirable to be able to deposit the high dielectric constant materials while limiting the growth of interfacial layers of silicon oxides.

D. Dopant Diffusion

Device reliability can be degraded if dopants such as boron penetrate into the gate oxide regions. For example, such penetration can occur if a p-type dopant is introduced into a conductive polysilicon layer over a gate oxide layer. Gate oxide is relatively permeable to boron atoms, and thus, with the thermal cycling that occurs during subsequent semiconductor manufacturing steps, there can be opportunity for dopant atoms to diffuse from the doped polysilicon regions and into the gate oxide regions. Diffusion of boron atoms can degrade the insulating properties of the gate oxide and prevent adequate charge from being stored in the gate, and can result in leakage currents from the gate to the substrate. Moreover, as device dimensions are reduced to meet the demands of smaller, faster semiconductor devices, the problems associated with dopant diffusion can become greater. Therefore, it can be desirable to limit the diffusion of boron and/or other dopant atoms from polysilicon gates into the underlying gate oxide regions.

Another object of this invention is the manufacture of semiconductor devices comprising insulators having increased capacitance.

Another object of this invention is the manufacture of semiconductor devices having decreased gate insulator thickness.

SUMMARY OF THE INVENTION

This invention addresses the above problems caused by interfacial oxide by providing a nitrided silicon substrate under the pad or sacrificial oxide layer. This nitrided silicon substrate can be provided by the implantation of nitrogen ions through the pad oxide or sacrificial oxide layer and into the silicon layer. By providing such a nitrided silicon substrate, subsequent exposure of the semiconductor wafer to oxidating conditions suitable for deposition of high dielectric constant insulators can result in reduced growth of interfacial oxide compared to growth of insulating layers without the nitrided silicon substrate. The sacrificial oxide layer can be subsequently etch off, revealing the underlying nitrided silicon substrate, thereby permitting the deposition of high dielectric constant material directly on the nitrided silicon substrate with little intervening interfacial oxide.

Thus, one aspect of this invention is the implantation of nitrogen ions through a sacrificial oxide layer to form an implanted nitride, and subsequent removal of the sacrificial oxide layer.

An additional aspect of this invention is the deposition of a layer of high dielectric constant material on an exposed nitrided silicon substrate, thereby resulting in an insulating layer having less interfacial oxide underneath.

A further aspect of this invention is the manufacture of semiconductor devices having high dielectric constant insulating layers with reduced interfacial oxide.

Another aspect of the invention is the manufacture of semiconductor devices having different types of insulating layers in different regions of the semiconductor wafer.

BRIEF DESCRIPTION OF THE FIGURES

This invention will be described with respect to the particular embodiments thereof. Other objects, features and advantages of the invention will become apparent with reference to the specification and drawings in which.

DETAILED DESCRIPTION

This invention includes methods for the formation of a nitrided silicon substrate. The term "nitrided silicon substrate" means a silicon nitride region positioned underneath an existing sacrificial oxide region on a semiconductor substrate. The term "silicon substrate" means the area of a wafer underneath any layer of oxide, including sacrificial oxide or pad oxide. One way of manufacturing nitrided silicon substrate is via the implantation of N+ions through the sacrificial oxide layer and into the silicon substrate. The implanted nitride layer then can act as an etch-stop, so that subsequent etching of the sacrificial oxide region can be accomplished more completely, thereby exposing the underlying nitrided silicon substrate. Subsequently, high-dielectric constant layers can be formed on the nitrided silicon substrate while minimizing the formation of interfacial oxide. This process thereby minimizes the gate oxide equivalent thickness of the high-dielectric constant layers and therefore permits effective gate insulation with thinner layers of material. In such a fashion, the problems associated with interfacial oxide can be minimized. Additionally, N+ implantation can be carried out in a regional fashion, thereby permitting the manufacture of semiconductor wafers having areas of implanted nitride and other areas not having implanted nitride. Such regional implantation can permit the manufacture of a variety of different gate oxide and dielectric materials on the same wafer, thereby permitting the manufacture of a variety of different types of semiconductor devices on a single wafer.

The methods of this invention can be advantageously used in the manufacture of any type of semiconductor device having an insulating layer. Moreover, the type of electrical isolation used is not critical, and can be either shallow trench isolation ("STI") or Local Oxidation of Silicon ("LOCOS"). Although both types of electrical isolation can be used, examples below refer to the STI type of isolation.

A. Nitrogen Ion Implantation Before Deposition of Trench-Filling Oxide In Manufacture of STI To manufacture semiconductor devices having a nitrided silicon substrate formed under the sacrificial oxide layer, N+ ion implantation can be used. In the Figures that follow, like numbers refer to like elements. FIGS. 5–9 depict the manufacture of semiconductor wafers using nitrogen ion implantation before the deposition of trench filling oxide. In this embodiment, semiconductor wafers are provided having a p-type dopant, although wafers having n-type dopants can be treated as advantageously as wafers having p-type dopants. Semiconductor wafers typically can have a layer of sacrificial oxide having a thickness of about 150 Å on the silicon substrate surface. In general, to make the nitrided silicon substrate of this invention, the sacrificial oxide-coated substrate can be implanted with nitrogen ions (N+) using an ion beam implantation method. The energy of the ion implantation can be adjusted to provide sufficient penetration of N+ ions through the sacrificial oxide region and into the underlying silicon substrate region to form nitrided silicon substrate.

Figure 5:
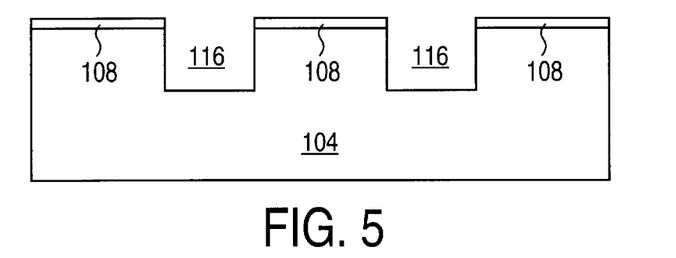
FIG. 5 depicts an embodiment of this invention, showing a semiconductor wafer as shown in FIG. 3, but additionally having the nitride layer removed in preparation for nitrogen ion implantation of the methods of this invention.
Figure 6:
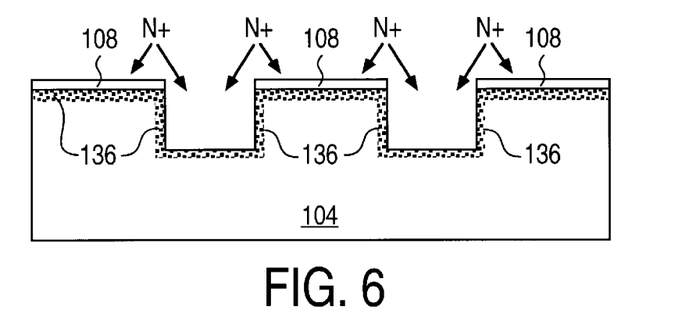
FIG. 6 depicts the wafer as shown in FIG. 5, wherein nitrogen ions are being implanted in the silicon substrate beneath the layer of surface oxide.

FIG. 5 depicts a semiconductor wafer 100 comprising a silicon substrate 104 and having a layer of sacrificial oxide 108 thereon. Shallow trenches 116 are inscribed in the silicon substrate 104 as part of the formation of STI. FIG. 6 depicts the implantation of nitrogen ions (N+) in the wafer. Some of the N+ ions penetrate the oxide layer 108 and become lodged in the silicon substrate 104 under sacrificial oxide layer 108 thereby forming a nitrided silicon substrate 136. Other N+ ions are directed downwards into the shallow trenches, where they penetrate into the silicon substrate 104 on the sidewalls and/or at the bottom of shallow trench 116 thereby forming nitrided silicon substrate at the silicon surface within the shallow trench.

The depth of the region of nitrided silicon substrate can be sufficient to provide etch-stop functions. Typically, for sacrificial oxide thicknesses in the range of about 40 Å to about 200 Å, the depth of the nitrided silicon substrate can be in the range of about 1 Å to about 500 Å, alternatively about 150 Å. However, if the desired conditions of subsequent oxide etching are high, as when it is desirable to remove a thick oxide layer, or if the removal rates of the oxide layer are high, the depth of the nitrided silicon substrate can be greater than about 500 Å, and can be as high as about 1500 Å. Thus, the depth of the nitrided silicon substrate can be varied to accommodate a variety of etching conditions by selecting the energy used for ion implantation.

To obtain a nitrided silicon substrate having a desired depth and implanted dose of N+ ions, it can be desirable to select an ion implantation beam energy sufficient to penetrate through the sacrificial oxide layer. Typically, higher energies can be used if the sacrificial oxide thickness is greater. By way of example, for a sacrificial oxide layer having a thickness of about 40 Å, an ion beam energy of about 5 KeV to about 10 KeV can be used. Alternatively, for a sacrificial oxide thickness of about 200 Å, an ion beam energy of about 20 KeV to about 50 KeV can be used. It can be desirable to select ion beam energies sufficiently low to limit the implantation of N+ ions to areas near the surface of the silicon substrate, thereby minimizing the depth of the nitrided silicon substrate and consequently, minimizing the possible damage to the nitrided silicon substrate caused by the N+ implantation. By maintaining such a relatively shallow nitrided silicon substrate, subsequent etching away of the nitrided silicon substrate, if desired, can be carried out more efficiently and more rapidly than for deeper nitrided silicon substrates. Therefore, device dimensions can be minimized, and the time necessary for manufacturing processes can be minimized.

Sufficient ions can be implanted to reach an ion concentration within the silicon substrate in the range of about $10^{13}$ ions/cm$^3$ to about $10^{18}$ ions/cm$^3$, or in an alternative embodiment in the range of about $10^{15}$ ions/cm$^3$ to about $10^{16}$/cm$^3$. Expressing ion implantation as an ion implantation dose per unit area, implantation can be in the range of about $10^{13}$ ions/cm$^2$ to about $10^{15}$ ions/cm$^2$. Increasing N+ ion concentration can result in a nitrided silicon substrate having high mechanical strength and/or chemical resistance, thereby providing greater polish-stop and/or etch-stop properties. Moreover, increasing the N+ concentration in the silicon substrate can decrease the subsequent growth of the interfacial oxide layer, whereas decreasing the N+ concentration can increase the subsequent growth of the interfacial oxide layer. However, if the depth of the nitrided silicon substrate is too great, or if the ion implantation energy is too high, defects in the device can appear. Therefore, one can select the conditions of ion implantation necessary to manufacture nitrided silicon substrates having desired depth, mechanical strength, and chemical resistance, while minimizing undesired manufacturing defects. Thus, using the methods of this invention, one can produce nitrided silicon substrates having a desired ability to regulate subsequent interfacial oxide growth during the deposition of the high-dielectric constant material.

Figure 7:
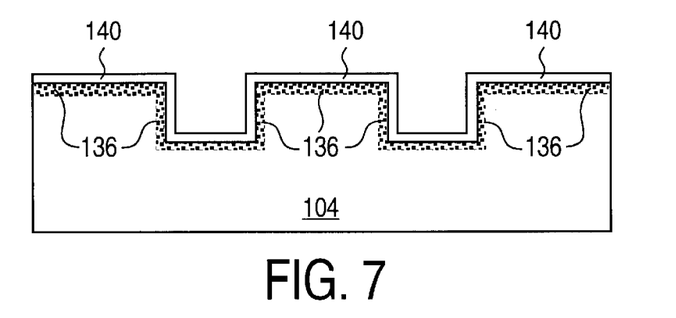
FIG. 7 depicts the wafer as shown in FIGS. 5–6, having a layer of liner oxide deposited on the surfaces of the wafer.

After N+ ion implantation, subsequent processing steps can then be carried out to complete the manufacture of gate structures. FIG. 7 depicts an additional step in semiconductor manufacture according to the methods of this invention. A layer of liner oxide 140 is formed on top of the nitride layer and within the shallow trench 116. The liner oxide can be made using methods known in the art, including but not limited to dry oxidation in the presence of $O_2$ at a temperature of about 950° C. for about 30 minutes. The liner oxide 140 can form the surface for subsequent deposition of field oxide within shallow trench 116.

Figure 8:
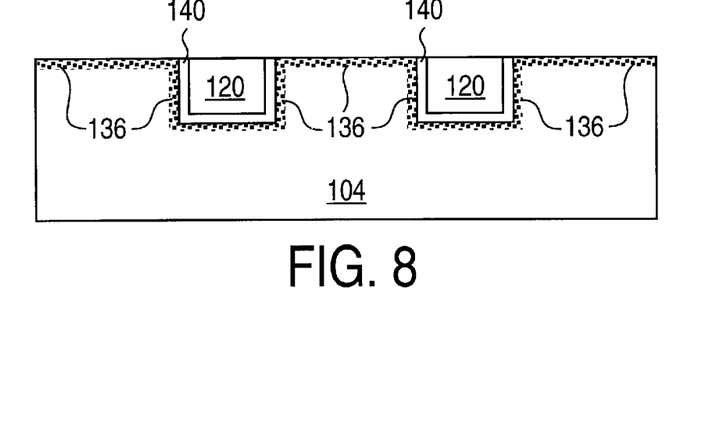
FIG. 8 depicts the wafer as shown in FIGS. 5–7, having the shallow trenches filled with field oxide and removal of the sacrificial oxide.

FIG. 8 depicts the semiconductor wafer as shown in FIG. 7, but after filling the shallow trenches with field oxide 120. The field oxide used can be selected to minimize the within-trench stress. By way of example, high density plasma vapor deposition (HDPCVD) can be used to deposit a layer of oxide derived from tetraethylorthosilicate ("TEOS") according to methods described in co-pending patent application titled: Process for Manufacturing Shallow Trenches Filled with Dielectric Material Having Low Mechanical Stress, Inventor, Hyeon-Seag Kim et al., Ser. No.: 09/240,560, filed Jan. 29, 1999, incorporated herein fully by reference. Additionally, layers of TEOS $O_3$ can be deposited within the shallow trenches as described in the above-referenced patent application. After the deposition of trench-filling material 120 the surface portion of oxide layer 140 of FIG. 7 is etched away and the surface is planarized, revealing the nitrided silicon substrate.

Figure 9:
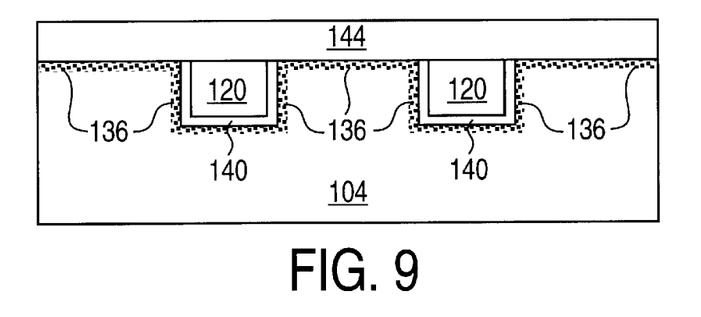
FIG. 9 depicts the wafer as shown in FIGS. 5–8, having a layer of high dielectric constant material deposited on top of the wafer.

FIG. 9 depicts the semiconductor wafer as shown in FIGS. 7–8, but having a layer of high dielectric constant material 144 deposited on top of the planarized surface of the wafer. In this embodiment of the invention, the high dielectric constant layer is deposited directly on the nitrided silicon substrate 136, so that there is minimal interfacial oxide present. This result is accomplished because the growth rate of interfacial oxide on a nitrided silicon surface is substantially less than the growth rate of oxide on bare silicon. Thus, the presence of the nitrided silicon substrate can decrease the growth of interfacial oxide. By removing the sacrificial oxide layer 108, there is little residual oxide present to initiate oxide growth. Therefore, the capacitance of the insulating layer of high dielectric constant material 144 reflects the dielectric constant of the high dielectric constant material, and the capacitance is not limited by the presence of the relatively lower dielectric constant interfacial oxide of the prior art methods.

The high dielectric constant materials desirable for use with the methods of this invention include tantalum pentoxide ($Ta_2O_5$), aluminum oxide ($Al_2O_3$), silicon nitride ($Si_3N_4$), zirconium dioxide ($ZrO_2$), titanium dioxide ($TiO_2$), barium-strontium-titanium oxide ("BST"), and lead-zirconium-titanium oxide ("PZT"), although other materials can also be used. Tantalum pentoxide has a dielectric constant of about 30, and therefore, is useful high because it can be made into an insulating layer having high capacitance. Other materials, having dielectric constants up to about 200, are known in the art and can be desirably used in the methods of this invention. Therefore, it is possible to make films comprising mixtures of these high-dielectric constant materials and conventional insulating materials such as $SiO_2$, thereby producing films having dielectric constants intermediate between that of $SiO_2$ and that of the high-dielectric constant material. Therefore, methods that can be used to form high dielectric constant layers are of increasing value in semiconductor manufacturing.

B. Nitrogen Implantation after Deposition of Trench Filling Oxide for STI

Figure 10:
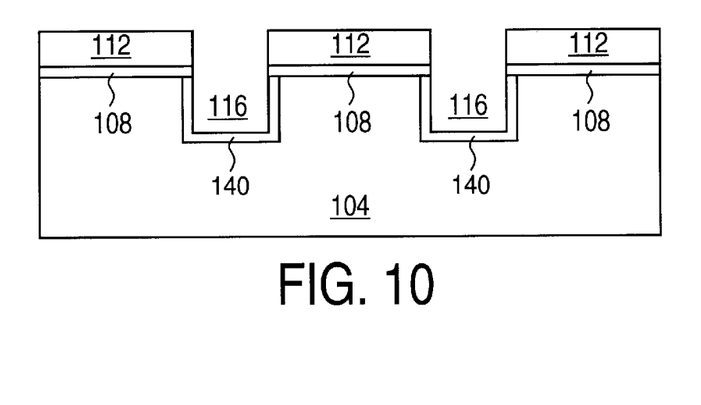
FIG. 10 depicts the wafer as shown in FIG. 3, having a layer of liner oxide deposited on the surfaces of the shallow trench.

FIGS. 10–15 depict an alternative embodiment of this invention, wherein the N+ ion implantation can be performed after deposition of trench-filling oxide. FIG. 10 depicts a semiconductor wafer comprised of a silicon substrate 104. As in FIG. 3, a layer of sacrificial oxide 108 is formed on the surface of the substrate 104. A layer of nitride 112 is deposited on the surface of sacrificial oxide layer 108, and shallow trenches 116 are formed. Subsequently, a layer of liner oxide 140 is formed within shallow trenches 116 by methods known in the art, including but not limited to dry oxidation in the presence of $O_2$ at a temperature of about 950° C. for about 30 minutes. After its formation, liner oxide 140 and sacrificial oxide 108 cover respective portions of the silicon substrate 104.

Figure 11:
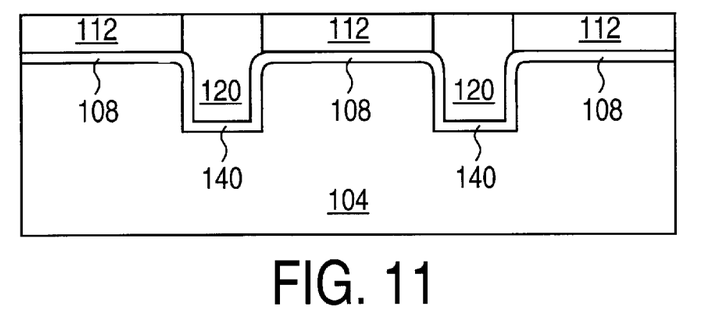
FIG. 11 depicts the wafer as shown in FIG. 10, having the shallow trenches filled with field oxide.
Figure 12:
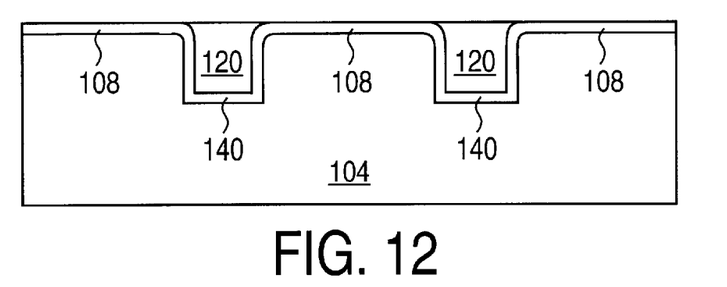
FIG. 12 depicts the wafer as shown in FIGS. 10–11 after planarization.

FIG. 11 depicts a wafer as shown in FIG. 10, but after the filling of the shallow trenches depicted in FIG. 12 (116) with field oxide 120. Liner oxide layer 140 provides an interface between field oxide region 120 and the silicon substrate 104. Trench filling oxide can be deposited using HDPCVD or TEOS/$O_3$ methods, depending on the desired mechanical stress within the shallow trench. Alternatively, on can deposit alternating layers of HDPCVD oxide and TEOS/$O_3$ to fashion trench-filling oxides having minimal mechanical stress (see co-pending Patent Application entitled: Process for Manufacturing Shallow Trenches Filled with Dielectric Material Having Low Mechanical Stress, Inventor, Hyeon-Seag Kim et al., Ser. No. 09/240,560, filed Jan. 29, 1999, incorporated herein fully by reference). By minimizing the mechanical stress within the shallow trenches, fewer defects form and the device reliability and the functional lifetimes of the semiconductor devices increases. Using the methods of this embodiment, the sidewall of the shallow trench is not as uniform as those depicted for the previous embodiment shown in FIGS. 5–9, but are improved compared to prior art methods.

FIG. 12 depicts the wafer as shown in FIGS. 10–11, but after the nitride layer 112 has been etched away and the surface of the wafer planarized using chemical mechanical planarization. Sacrificial oxide layer 108 and field oxide 120 are depicted as co-planar, with liner oxide 140 providing an interface between field oxide 120 and silicon substrate 104.

Figure 13:
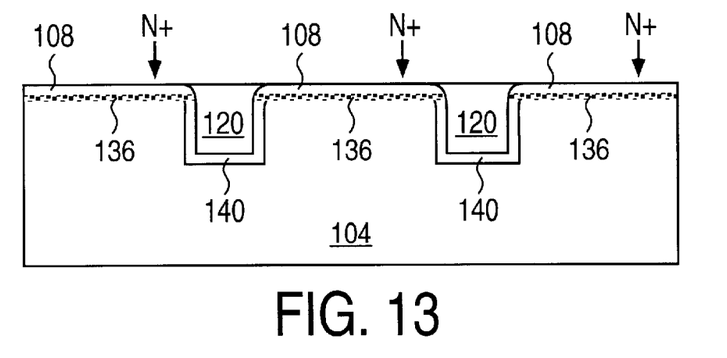
FIG. 13 depicts the wafer as shown in FIGS. 10–12 during implantation of nitrogen ions under the layer of sacrificial oxide.

FIG. 13 depicts the wafer as shown in FIGS. 10–12, but during N+ implantation. N+ ions (N+) are directed downwards toward the wafer and penetrate the pad oxide layer 108. After penetrating the sacrificial oxide layer 108, the N+ ions penetrate the surface of the silicon substrate 104, where they form the nitrided silicon substrate 136. In this embodiment, field oxide region 120 is sufficiently thick so that N+ ions do not substantially penetrate through layer 120. Thus, the nitrided silicon substrate 136 does not extend to the bottom of the shallow trench. Furthermore, because the field oxide region 120 has already been formed before the N+ implantation, the sidewalls of the filled trench are not as vertical as in the previously described embodiment as depicted in FIGS. 5–9 and in section A above.

Figure 14:
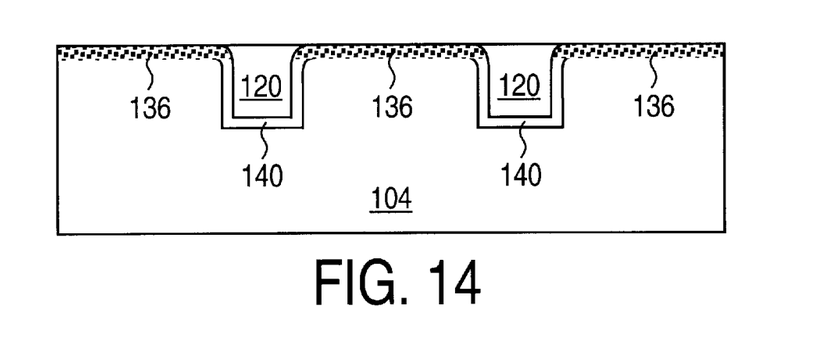
FIG. 14 depicts the wafer as shown in FIGS. 10–13, after removal of the sacrificial oxide.

FIG. 14 depicts the semiconductor wafer shown in FIGS. 10–13, but after etching away the sacrificial oxide layer 108 and the top portion of field oxide region 120. Because the implanted nitrided silicon substrate 136 acts as an etch-stop, the etching of the sacrificial oxide 108 is shown to be substantially complete, thus exposing the nitrided silicon substrate 136 for further processing, such as the deposition of a high-dielectric constant material.

Figure 15:
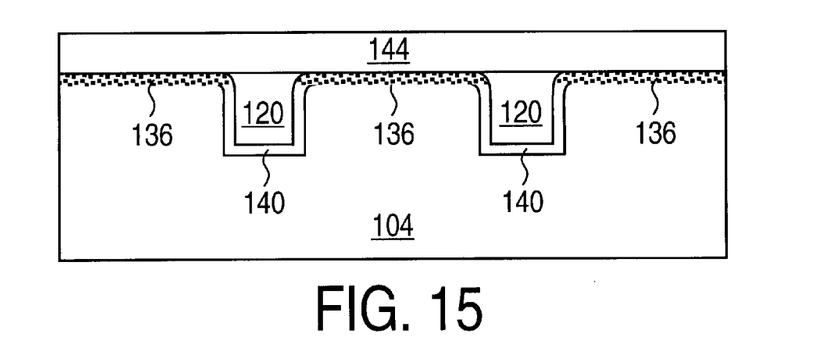
FIG. 15 depicts the wafer as shown in FIGS. 10–14, after deposition of a layer of high dielectric constant material on the nitrided silicon substrate.

FIG. 15 depicts the semiconductor wafer as shown in FIGS. 10–14, but after the formation of a high dielectric constant layer 144. As in the previous embodiment (FIG. 9), the high dielectric constant layer does not have an underlying layer of interfacial oxide present. Thus, the dielectric constant and therefore the capacitance of the high dielectric constant layer is greater than that obtained using prior art methods that result in a mixed high dielectric constant/oxide insulating layer (FIG. 4).

Thus, for both of the embodiments described in section A above and section B herein, the formation of a high dielectric constant layer can be carried out in a fashion that minimizes the growth of interfacial oxide. By using the N+ ion implantation methods of this invention, one can provide thin insulating layers having higher gate equivalent oxide thickness and having a dielectric constant that more closely reflects the dielectric constant of the high dielectric constant material. Furthermore, semiconductor devices can be made incorporating the methods of this invention that are of smaller size, higher device density, better reliability, and longer lifetimes that can be obtained using conventional high dielectric constant methods.

C. Use of N+ Implantation to Decrease Dopant Diffusion

Nitrogen ion implantation methods of this invention can provide benefits by decreasing the diffusion of boron, other p-type dopants, or n-type dopants. In conventional methods for forming logic devices, a substrate is overlain with an insulating layer of gate oxide. A layer of conductive material, typically a layer of polysilicon can be formed on top of a gate oxide layer, thereby forming a gate structure. In certain embodiments, the polysilicon gate can be doped with p-type dopants such as boron. After formation of a doped polysilicon layer, however, successive manufacturing steps involving heating steps can cause boron or other dopant atoms to diffuse from the polysilicon gate into the gate oxide. Boron atoms and/or other dopant atoms can alter the charge retention characteristics of the gate. By way of example, if boron is the dopant, boron atoms can diffuse into the gate oxide region, and thereby permitting charge loss from the gate through the gate oxide region. This charge loss can result in poor device reliability and short device lifetimes.

However, using the N+ implantation method for forming implanted nitrided silicon substrate, some of the implanted but un-reacted N+ ions can diffuse upwards from the silicon substrate into the gate oxide region. The presence of N+ ions in the gate oxide region can inhibit the diffusion of boron atoms from penetrating into the gate oxide region from a doped polysilicon gate above the gate oxide region. By way of example, Liu et al. "High Performance 0.2 $\mu$m CMOS with 25 Å Gate Oxide Grown on Nitrogen Implanted Si Substrates" IEDM 19.2.1 (1996), incorporated herein fully by reference, found that boron in a polysilicon layer did not diffuse through an oxide layer and past the furthest extent of N+ ion diffusion from the substrate into a gate oxide region.

By implanting N+ ions according to the methods of this invention, dopant diffusion into the gate region having high-dielectric constant materials can be decreased by effects similar to those described above for conventional gate oxides. In devices manufactured with high-dielectric constant materials without implanted N+ ions, the problem of dopant diffusion can be more pronounced than that observed for conventional gate oxide materials. This may be because as the thickness of high-dielectric constant insulators can be reduced compared to the thicknesses of layers of conventional gate oxide insulators, the distance through which dopant ions must diffuse to cause device reliability problems can be less than the diffusion distance for conventional gate oxide insulators. Thus, without the N+ diffusion into the gate oxide layer, reductions in device reliability can be greater for devices incorporating thin layers of high-dielectric constant materials.

Therefore, the ability of implanted N+ ions to diffuse after implantation and deposition of high-dielectric constant materials into the gate oxide region can be particularly desirable in situations wherein the thickness of the high-dielectric constant material is reduced to accommodate decreased device dimensions made possible by the use of high-dielectric constant insulators.

D. Regional N+ Implantation

In addition to providing the overall advantages of N+ ion implantation described above, the methods of this invention can be applied to the manufacture of semiconductor devices having different types of gate oxide structures formed on the same semiconductor wafer.

FIGS. 16–19 depict an embodiment of this invention wherein certain regions are made having high dielectric constant layers and other regions are made having conventional gate oxide structures.

Figure 16:
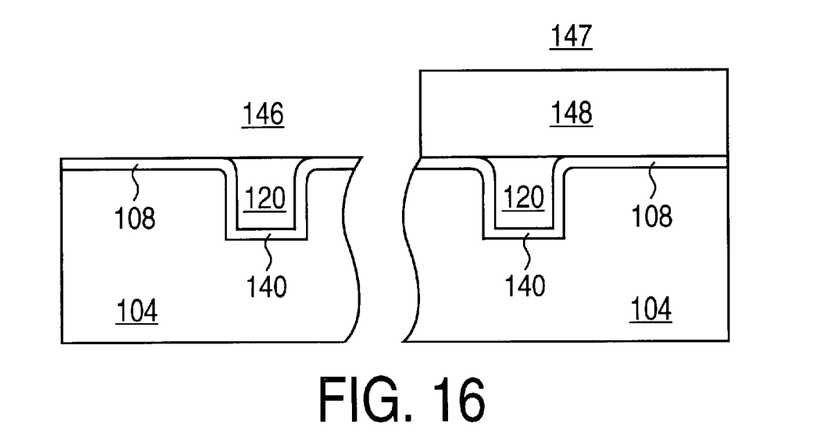
FIG. 16 depicts another embodiment of this invention, comprising a semiconductor wafer having two regions, one having a photoresist mask, and the other having no photoresist mask in preparation for nitrogen ion implantation.

FIG. 16 depicts a semiconductor wafer having a region 146 on the left side of the figure, and a region 147 on the right side of the figure. The entire wafer has been prepared as described above in Section A, up to and including the step shown in FIG. 12. Subsequently, a photoresist layer 148 is deposited in region 147, thereby preventing N+ ions from being subsequently implanted in region 147. In contrast, region 146 is not masked with photoresist layer 148.

Figure 17:
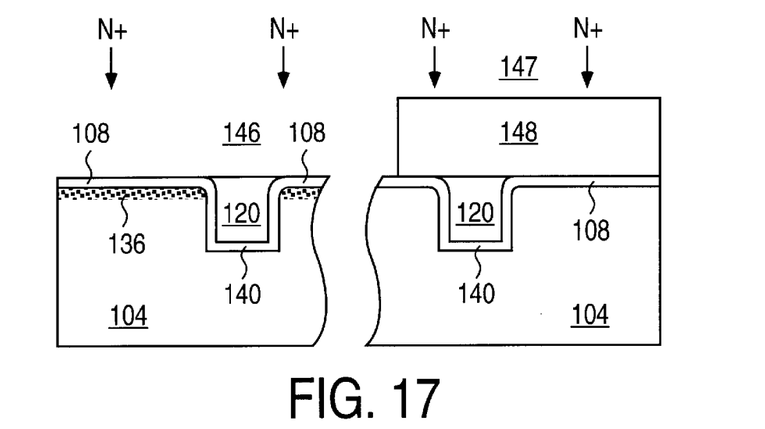
FIG. 17 depicts the semiconductor wafer as shown in FIG. 16, during implantation of nitrogen ions under the sacrificial oxide regions of the non-masked portion of the wafer.

FIG. 17 depicts the semiconductor wafer shown in FIG. 16 during N+ ion implantation. In region 146, N+ ions penetrate through sacrificial oxide layer 108 and penetrate into the silicon substrate 104 where they interact with silicon atoms to form an implanted nitride layer 136. However, in region 147, the photoresist layer 148 prevents the N+ ions from penetrating through to the silicon layer, and thus, no implanted nitride layer is formed in region 147.

Figure 18:
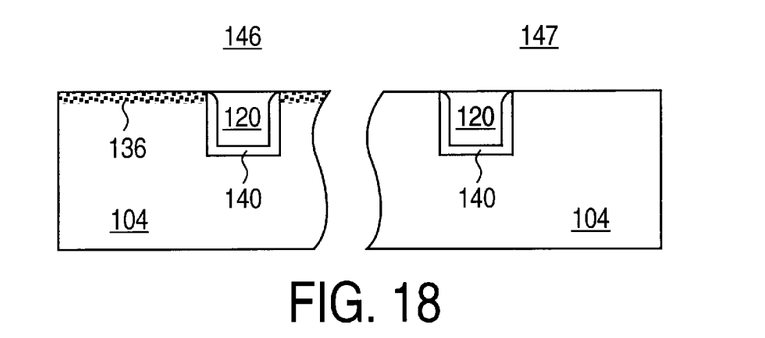
FIG. 18 depicts the wafer as shown in FIGS. 16–17, after stripping the photoresist layer and planarization.

FIG. 18 depicts the same wafer as shown in FIGS. 1–17, except that photoresist layer 148 and the sacrificial oxide layer have been etched off. In region 146, the implanted nitrided silicon substrate 136 is present at the wafer surface, whereas in region 147 no implanted nitrided silicon substrate is present and the field oxide 120 and silicon substrate 104 are exposed.

Figure 19:
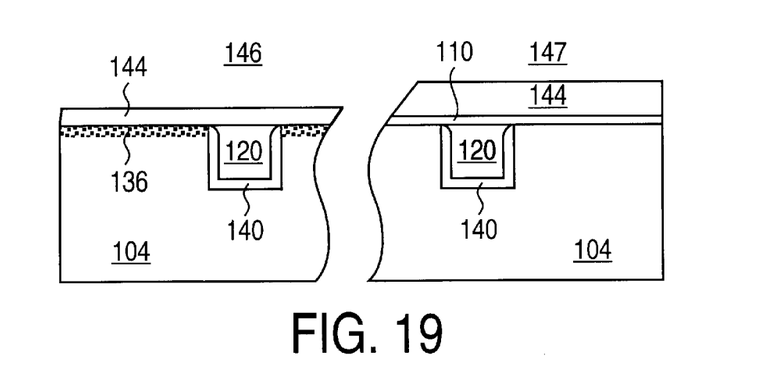
FIG. 19 depicts the wafer as shown in FIGS. 16–18, after formation of a layer of high dielectric constant material on the region that had nitrogen ion implantation and after formation of a mixed insulator on the region of the wafer that had been masked with photoresist material.

FIG. 19 depicts the same wafer as shown in FIGS. 16–18, except for the further formation of gate insulating regions. In region 146, a high dielectric constant layer 144 is deposited directly upon the implanted nitrided silicon substrate 136. In region 147, the gate insulator comprises an interfacial oxide 110 with a layer of high dielectric constant material 144 deposited thereon. Alternatively, the gate insulator in region 147 can be any conventional gate oxide material, such as by way of example, $SiO_2$.

E. Manufacture of Semiconductor Devices Incorporating N+ Implanted Nitrided Silicon Substrate Application of the regional N+ implantation with conventional dielectric materials having a K of about 3.9, it can be desirable to provide a gate oxide thicknesses of about 30 Å–about 150 Å, depending on the type of semiconductor device being manufactured. For manufacturing volatile memory devices, the conventional gate oxide can have a thickness in the range of about 50 Å to about 60 Å, for logic devices the gate oxide thicknesses can have a thickness in the range of about 30 Å to about 45 Å, and for non-volatile memory devices the gate oxide layers can have a gate oxide thickness in the range of about 80 Å to about 150 Å.

Providing dielectric materials having increased K can permit the reduction in the thickness of the equivalent gate oxide. By way of example, the deposition of a material having a K of about 20 can permit the deposition of a gate insulating layer having a thickness of about 10 Å. Moreover, the deposition of a material having a K of about 50 can permit the deposition of gate insulating layers of about 5 Å, and the deposition of a material having a K of about 200 can permit the deposition of gate insulating layers of about 1 Å and still provide adequate insulating ability.

The types of semiconductor devices manufactured using the methods of this invention are not limited. Rather, erasable, programmable, read only memory ("EPROM") devices can be made that use low power by incorporating N+ and high-dielectric constant materials. Alternatively, high power EPROMs can be made incorporating $SiO_2$ or other low K material as the gate insulator. Furthermore, improved tunneling oxide layers can be made that incorporate high dielectric constant materials deposited using N+ implanted nitrided silicon substrate.

After the deposition of insulating materials according to the methods of this invention, completion of the manufacture of semiconductor devices can be carried out using methods known in the art. Any typically used conductive material can be used as the gate conductor. For example, the conductive material can be polysilicon, platinum, WSi, Co,$TiN_2$ or $RuO_2$. After manufacturing the gate structure, metal vias and plugs, lines, passivation layers and other components of semiconductor products can be made using methods known in the art.

Using the regional implantation methods described above, one can manufacture semiconductor devices of different types on the same wafer. For example, it is possible to manufacture semiconductor systems on a single semiconductor chip that comprise flash EEPROM devices, volatile memory devices, non-volatile memory devices and/or small, high-speed logic devices in different combinations and configurations..

The specific embodiments of the invention described herein are intended to be exemplary only. Other embodiments of this invention are possible, and all are considered to be part of this invention.

INDUSTRIAL APPLICABILITY

The methods of this invention are useful in the manufacture of semiconductor devices having improved electrical properties and reduced feature sizes due to the decreased thickness of interfacial oxide layers. Semiconductor devices incorporating the improved methods have better performance, longer useful lifetimes, and are less expensive to manufacture.

I claim:

1. A method for forming a semiconductor insulating layer, comprising the steps of:

providing a semiconductor wafer having a silicon substrate and having a layer of sacrificial oxide thereon;

forming a patterned barrier layer on said sacrificial oxide layer;

forming shallow trenches;

implanting nitrogen ions through said sacrificial oxide layer and into said silicon substrate;

removing said sacrificial oxide layer; then providing a liner oxide layer in said trench;

filling said shallow trenches with a low stress insulating material; and depositing a layer of high-dielectric constant insulating material on said implanted nitrided silicon substrate.

2. The method of claim 1, wherein after the step of deposition said layer of high dielectric constant insulating material, further comprising forming a gate structure on said high-dielectric constant insulating material.

3. The method of claim 1, wherein said step of implanting nitrogen ions comprises using ion beam implantation.

4. The method of claim 3, wherein said ion beam implantation is carried out using an energy in the range of about 5 KeV to about 50 KeV.

5. The method of claim 3, wherein said ion beam implantation implants nitrogen ions in a concentration in the range of about $10^{—}$ ions/$cm^3$ to about $10^{18}$ ions/$cm^3$.

6. The method of claim 3, wherein said ion beam implantation implants nitrogen ions at a dose of about $10^{13}$ ions/$cm^2$ to about $10^{15}$ ions/$cm^2$.

7. The method of claim 1, wherein the high-dielectric constant insulating layer comprises a material having a dielectric constant in the range of greater than about 4 to about 200.

8. The method of claim 1, wherein the high-dielectric constant insulating layer comprises a material selected from the group consisting of $Ta_2O_5$, $Al_2O_3$, $Si_3N_4$, $ZrO_2$, $TiO_2$, barium-strontium-titanium oxide and lead-zirconium-titanium oxide.

9. The method of claim 1, wherein the depth of said nitrided silicon substrate is in the range of about 1 Å to about 1500 Å.

10. The method of claim 1, wherein said step of removing said oxide layer is carried out by etching.

11. The method of claim 1, wherein said semiconductor wafer has at least two regions, each of said regions having a layer of sacrificial oxide thereon, and wherein nitrogen ion implantation is carried out in one region of said semiconductor wafer, and nitrogen ion implantation is not carried out in another of said regions of said semiconductor wafer.

12. The method of claim 1, further comprising the step of forming a layer of conductive material on the surface of the high dielectric constant insulating material.

13. The method of claim 12, wherein said conductive material is selected from the group consisting of polysilicon, platinum, WSi, Co,TiN$_2$ and RuO$_2$.

14. A method for manufacturing a semiconductor device, comprising the steps of:
   providing a semiconductor wafer comprising a silicon substrate having a layer of sacrificial oxide thereon;
   forming shallow trenches on said wafer;
   implanting nitrogen ions through said sacrificial oxide, thereby forming an implanted nitrided silicon substrate;
   removing said sacrificial oxide; then
   providing a liner oxide layer in said trench;
   filling said trenches with a low stress oxide insulating material thereby forming field oxide regions; and
   forming gate insulators between said field oxide regions.

15. The method of claim 14, wherein said step of implantation nitrogen ions comprises using ion beam implantation.

16. The method of claim 15, wherein said step of ion beam implantation is carried out at an energy in the range of about 5 KeV to about 50 KeV.

17. The method of claim 15, wherein said ion beam implantation implants nitrogen ions in a concentration in the range of about $10^{13}$ to about $10^{18}$ ions/cm$^2$.

18. The method of claim 15, wherein said ion beam implantation implants nitrogen ions at a dose in the range of about $10^{13}$ ions/cm$^2$ to about $10^{15}$ ions/cm$^2$.

19. The method of claim 14, wherein said step of forming gate insulators comprises deposition of an insulating material having a high dielectric constant.

20. The method of claim 19, wherein said insulating material has a dielectric constant in the range of about 4 to about 200.

21. The method of claim 19, wherein the high-dielectric constant insulating layer comprises a material selected from the group consisting of Ta$_2$O$_5$, Al$_2$O$_3$, Si$_3$N$_4$, ZrO$_2$, TiO$_2$, barium-strontium-titanium oxide and lead-zirconium-titanium oxide.

22. The method of claim 14, wherein the depth of said nitrided silicon substrate is in the range of about 1 Å to about 1500 Å.

23. The method of claim 1, further comprising the step of forming a layer of conductive material on the surface of the high dielectric constant insulating material.

24. The method of claim 12, wherein said conductive material is selected from the group consisting of polysilicon, platinum, WSi, Co,TiN$_2$ and RuO$_2$.

25. A method for manufacturing a semiconductor device, comprising the steps of:
   providing a semiconductor wafer comprising a silicon substrate having a layer of sacrificial oxide thereon;
   forming shallow trenches on said wafer;
   implanting nitrogen ions through said sacrificial oxide, thereby forming an implanted nitrided silicon substrate;
   implanting nitrogen ions into said trench, thereby forming an implanted nitrided silicon substrate in said trench; then
   providing a liner oxide layer in said trench;
   removing said sacrificial oxide; and
   filling said shallow trenches with a low stress oxide.

26. The method of claim 25, wherein said step of implantation nitrogen ions comprises using ion beam implantation.

27. The method of claim 26, wherein said step of ion beam implantation is carried out at an energy in the range of about 5 KeV to about 50 KeV.

28. The method of claim 26, wherein said ion beam implantation implants nitrogen ions in a concentration in the range of about $10^{13}$ to about $10^{18}$ ions/cm$^3$.

29. The method of claim 26, wherein said ion beam implantation implants nitrogen ions at a dose in the range of about $10^{13}$ ions/cm$^2$ to about $10^{15}$ ions/cm$^2$.

30. The method of claim 25, further comprising the step of forming gate insulators by depositing on said nitrided silicon substrate an insulating material having a high dielectric constant.

31. The method of claim 30, wherein said insulating material has a dielectric constant in the range of about 4 to about 200.

32. The method of claim 30, wherein the high-dielectric constant insulating layer comprises a material selected from the group consisting of Ta$_2$O$_5$, Al$_2$O$_3$, Si$_3$N$_4$, ZrO$_2$, TiO$_2$, barium-strontium-titanium oxide and lead-zirconium-titanium oxide.

33. The method of claim 25, wherein the depth of said nitrided silicon substrate is in the range of about 1 Å to about 1500 Å.

34. The method of claim 30, further comprising the step of forming a layer of conductive material on the surface of the high dielectric constant insulating material.

35. The method of claim 34, wherein said conductive material is selected from the group consisting of polysilicon, platinum, WSi, Co,TiN$_2$ and RuO$_2$.

36. The method of claim 25, wherein said low stress oxide is formed using TEOS O$_3$.

37. The method of claim 25, wherein said low stress oxide is formed using TEOS O$_3$ and HDPCVD oxide.

38. The method of claim 25, wherein said low stress oxide is formed from multiple layers of TEOS O$_3$.

39. The method of claim 25, wherein said low stress oxide is formed from multiple layers of TEOS O$_3$ and HDPCVD oxide.

40. The method of claim 1, wherein said low stress oxide is formed using TEOS O$_3$.

41. The method of claim 1, wherein said low stress oxide is formed using TEOS O$_3$ and HDPCVD oxide.

42. The method of claim 1, wherein said low stress oxide is formed from multiple layers of TEOS O$_3$.

43. The method of claim 1, wherein said low stress oxide is formed from multiple layers of TEOS O$_3$ and HDPCVD oxide.

44. The method of claim 14, wherein said low stress oxide is formed using TEOS O$_3$.

45. The method of claim 14, wherein said low stress oxide is formed using TEOS O$_3$ and HDPCVD oxide.

46. The method of claim 14, wherein said low stress oxide is formed from multiple layers of TEOS O$_3$.

47. The method of claim 14, wherein said low stress oxide is formed from multiple layers of TEOS O$_3$ and HDPCVD oxide.

* * * * *

UNITED STATES PATENT AND TRADEMARK OFFICE
CERTIFICATE OF CORRECTION

PATENT NO. : 6,413,826 B2
DATED : July 2, 2002
INVENTOR(S) : Hyeon-Seag Kim

It is certified that error appears in the above-identified patent and that said Letters Patent is hereby corrected as shown below:

Column 12,
Line 40, "$10^-$ ions/cm$^3$" should read -- $10^{13}$ ions/cm$^3$ --.

Column 13,
Line 23, "ions/cm$^2$" should be -- ions/cm$^3$ --.

Signed and Sealed this

Twenty-eighth Day of January, 2003

JAMES E. ROGAN
*Director of the United States Patent and Trademark Office*